United States Patent
Katono et al.

(10) Patent No.: US 10,700,272 B2
(45) Date of Patent: Jun. 30, 2020

(54) SEMICONDUCTOR MEMORY DEVICE HAVING A PHASE CHANGE MATERIAL

(71) Applicant: TOSHIBA MEMORY CORPORATION, Tokyo (JP)

(72) Inventors: Kazuhiro Katono, Yokkaichi Mie (JP); Takeshi Ishizaki, Nagoya Aichi (JP); Atsuko Sakata, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/117,718

(22) Filed: Aug. 30, 2018

(65) Prior Publication Data

US 2019/0267543 A1   Aug. 29, 2019

(30) Foreign Application Priority Data

Feb. 27, 2018 (JP) .................. 2018-033580

(51) Int. Cl.
*H01L 45/00* (2006.01)

(52) U.S. Cl.
CPC ............ *H01L 45/06* (2013.01); *H01L 45/128* (2013.01); *H01L 45/1253* (2013.01); *H01L 45/144* (2013.01); *H01L 45/1625* (2013.01); *H01L 45/1633* (2013.01)

(58) Field of Classification Search
CPC ... H01L 45/06; H01L 45/1253; H01L 45/128; H01L 45/144; H01L 45/1625; H01L 45/1633
See application file for complete search history.

(56) References Cited

U.S. PATENT DOCUMENTS

| | | | |
|---|---|---|---|
| 6,859,389 B2 | 2/2005 | Idehara | |
| 7,453,081 B2 | 11/2008 | Happ et al. | |
| 7,786,470 B2* | 8/2010 | Kawakami | C07D 495/04 257/40 |
| 7,787,279 B2* | 8/2010 | Happ | H01L 45/1246 257/3 |
| 7,816,721 B2* | 10/2010 | Yamazaki | B82Y 10/00 257/306 |
| 8,357,920 B2* | 1/2013 | Jedema | H01L 45/06 257/2 |
| 8,685,291 B2* | 4/2014 | Schell | H01L 45/06 252/519.4 |
| 8,716,690 B2* | 5/2014 | Kim | H01L 45/00 257/2 |
| 9,040,949 B2* | 5/2015 | Mitani | G11C 11/56 257/1 |
| 9,406,721 B1 | 8/2016 | Yamamoto et al. | |
| 9,923,124 B2* | 3/2018 | Mazed | H01L 33/502 |

(Continued)

OTHER PUBLICATIONS

Cheng Peng et al., Al1.3Sb3Te material for phase change memory application, Applied Physics Letters 99, 043105, 2011, 3 pages.

(Continued)

*Primary Examiner* — Ida M Soward
(74) *Attorney, Agent, or Firm* — Kim & Stewart LLP

(57) ABSTRACT

According to one embodiment, the semiconductor memory device includes a first electrode, a first material layer, including a first material, located on the first electrode, a second material, surrounded by the first material of the first material layer, including a phase change material, and a second electrode provided on the first material.

15 Claims, 5 Drawing Sheets

(56) References Cited

U.S. PATENT DOCUMENTS

| | | | | |
|---|---|---|---|---|
| 10,559,444 | B2* | 2/2020 | Tsang | H01H 85/12 |
| 2006/0131569 | A1* | 6/2006 | Choi | B82Y 10/00 257/40 |
| 2009/0014318 | A1* | 1/2009 | Khang | C23C 14/0605 204/192.15 |
| 2009/0278108 | A1* | 11/2009 | Khang | G11C 13/0004 257/4 |
| 2010/0188884 | A1* | 7/2010 | Mitani | H01L 45/08 365/148 |
| 2010/0193763 | A1* | 8/2010 | Chen | B82Y 10/00 257/4 |
| 2012/0193595 | A1* | 8/2012 | Cheng | C23C 14/0623 257/2 |
| 2013/0001502 | A1* | 1/2013 | Jung | H01L 45/06 257/4 |
| 2015/0338709 | A1* | 11/2015 | Yoshida | G02F 1/136277 257/59 |
| 2016/0043106 | A1* | 2/2016 | Kimura | G02F 1/134309 257/43 |
| 2018/0102271 | A1* | 4/2018 | Jinbo | H01L 27/1214 |
| 2018/0212147 | A1* | 7/2018 | Ruiz | C11C 11/56 247/1 |
| 2018/0226010 | A1* | 8/2018 | Joo | G02F 1/25 |

OTHER PUBLICATIONS

Liangliang Cao et al., Advantage of Ti-Doped Ge2Sb2Te5 Material for Phase Change Memory Applications, ECS Solid State Letters, 4 (12) p. 102-p. 104, 2015, 3 pages.

N. Matsuzaki et al., Oxygen-doped GeSbTe Phase-change Memory Cells Featuring 1.5-V/100-μA Standard 0.13-μm CMOS Operations, IEEE, 4 pages.

* cited by examiner

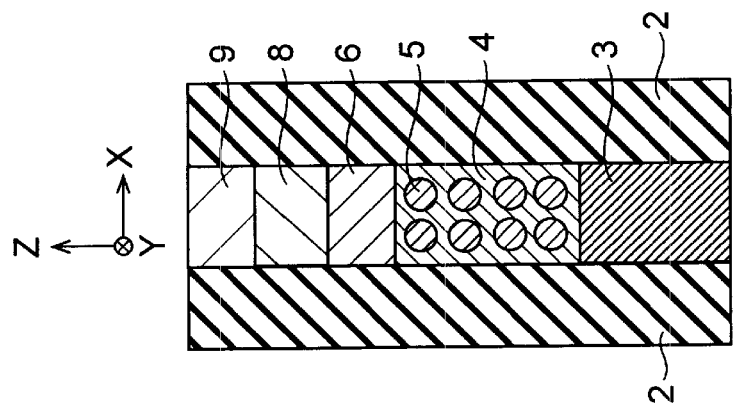

FIG. 3A 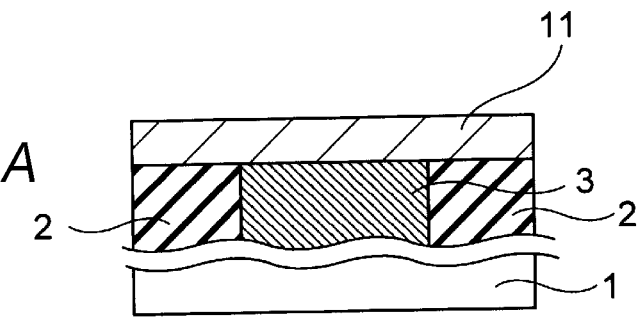 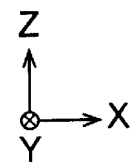
FIG. 3B 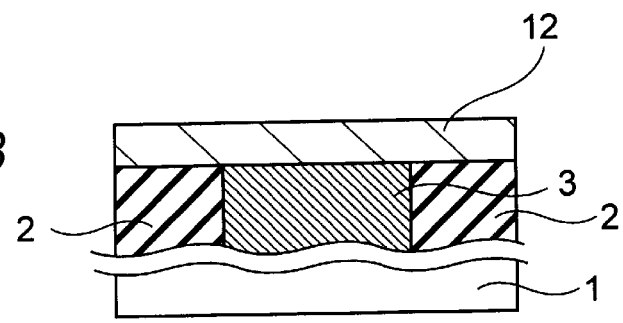 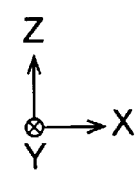
FIG. 3C 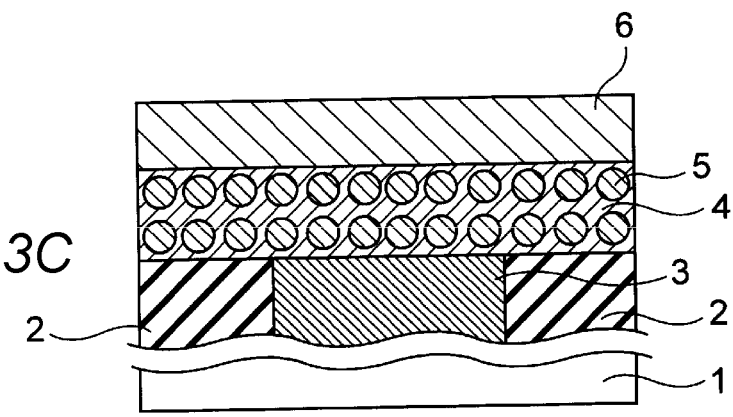 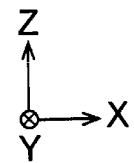

SEMICONDUCTOR MEMORY DEVICE HAVING A PHASE CHANGE MATERIAL

CROSS-REFERENCE TO RELATED APPLICATION

This application is based upon and claims the benefit of priority from Japanese Patent Application No. 2018-033580, filed on Feb. 27, 2018, the entire contents of which are incorporated herein by reference.

FIELD

Embodiments of the present disclosure relate to a semiconductor memory device and manufacturing methods thereof.

BACKGROUND

Phase-change memory (PCM) uses Joule heat produced by an operating current to set and reset data in phase-change materials. For this purpose, it is desirable to efficiently generate Joule heat to reduce the required operating current.

DESCRIPTION OF THE DRAWINGS

FIGS. 2A, 2B, 2C and 2D show cross-sectional views showing a structure of a semiconductor memory device according to various modifications of the first embodiment.

FIGS. 3A, 3B and 3C show cross-sectional views showing a method of manufacturing the semiconductor memory device according to the first embodiment.

DETAILED DESCRIPTION

Figure 1:
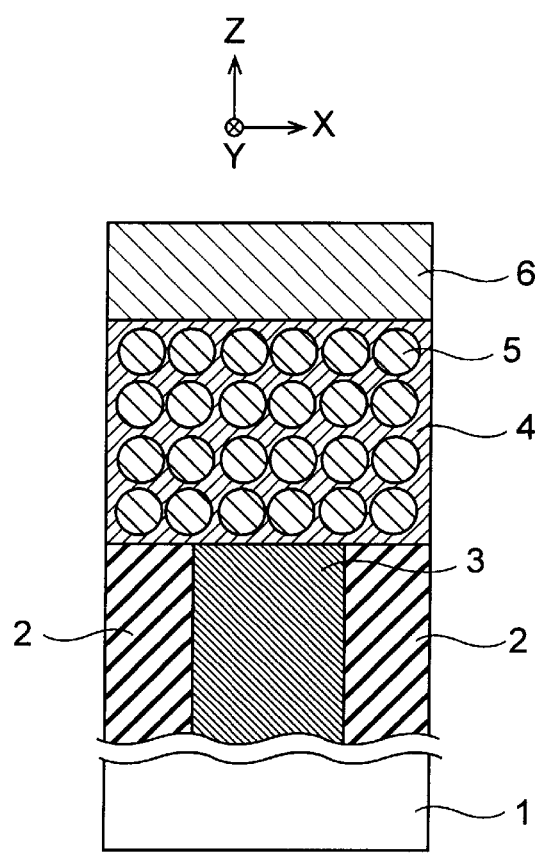
FIG. 1 shows a cross-sectional view showing a structure of a semiconductor memory device according to a first embodiment.

Embodiments provide a semiconductor memory device capable of reducing an operating current supplied to a phase-change material and methods of manufacturing the semiconductor memory device.

In one embodiment, the semiconductor memory device includes a first electrode, a first material layer, comprising a first material, located on the first electrode, a second material, surrounded by the first material of the first material layer, comprising a phase change material, and a second electrode provided on the first material. Hereinafter, embodiments of the present disclosure will be described with reference to the drawings. In FIGS. 1 to 5, the same or similar components are denoted by the same reference numerals, and duplicate descriptions are omitted where appropriate.

First Embodiment

FIG. 1 shows a cross-sectional view showing a structure of a semiconductor memory device according to a first embodiment.

The semiconductor memory device of FIG. 1 has a substrate 1, an insulating film 2, a lower electrode 3 (an example of a first electrode), a high-resistance material 4 (an example of a first material), a phase-change material 5 (an example of a second material), and an upper electrode 6 (an example of a second electrode). The semiconductor memory device of FIG. 1 is, for example, a cross point type phase-change memory device having a three-dimensional structure, but may be another type of phase-change memory device.

The substrate 1 may be a semiconductor substrate, such as a silicon substrate, for example. In FIG. 1, an X direction and a Y direction are parallel to the surface of the substrate 1 and perpendicular to each other, and a Z direction is perpendicular to the surface of the substrate 1. In the present specification, the +Z direction is the upward direction and the −Z direction is the downward direction, but the −Z direction may or may not coincide with the direction of gravity.

The insulating film 2 is formed on the substrate 1. The insulating film 2 is, for example, an interlayer insulating film such as a silicon oxide film. The insulating film 2 may be formed directly on the substrate 1 or may be formed on the substrate 1 with another layer interposed therebetween.

The lower electrode 3 is formed within the insulating film 2. The lower electrode 3 may consist of a barrier metal layer and an electrode material layer (i.e., a wire material) separately, or may be a layer that is both a barrier metal and an electrode material. The lower electrode 3 of the present embodiment has a TiN film as a layer that serves as both a barrier metal and an electrode material. The lower electrode 3 may consist of a TiN film as a barrier metal layer, and may include a W film, a WN film, a WSi film, or a WSiN film as an electrode material layer. The lower electrode 3 of the present embodiment extends in the Y direction and functions as a word line.

The high-resistance material 4 is formed on top of the lower electrode 3. The phase-change material 5 is located with the high-resistance material 4 and is surrounded by the high-resistance material 4. The phase-change material 5 of the present embodiment, in the form of a plurality of grain-shaped particles, is surrounded by the high-resistance material 4. These particles may be regularly distributed in the high-resistance material 4, as shown in FIG. 1, or may be irregularly distributed in the high-resistance material 4. The diameters of the particles of the present embodiment are 10 nm or less (e.g., 6 nm to 8 nm). These particles can be observed, for example, by SEM (Scanning Electron Microscope) or TEM (Transmission Electron Microscope).

The high-resistance material 4 is, for example, a GeOX film layer, which is an oxide film that contains germanium (Ge) and oxygen (O). Ge is an example of a first element of the high resistance material 4. The high-resistance material 4 may be a nitride film layer such as a GeN film layer instead of an oxide film layer such as a GeOX film layer. The high-resistance material 4 may contain at least one of Si (silicon), Al (aluminum), Co (cobalt), Ti (titanium), Ta (tantalum), Hf (hafnium), Zr (zirconium), and Y (yttrium) instead of or in addition to Ge. The free energy of formation of oxides or nitrides of these elements is smaller than the free energy of formation of the same oxides or nitrides constituting the phase-change material 5. The value of X in the GeOX film is, for example, 1.0 or more, and the number of O atoms is equal to or more than the number of Ge atoms.

The phase-change material 5 is, for example, an SbTeX film, and is a metallic film that contains Te (tellurium) and Sb (antimony). Te and Sb are examples of a second element. When an operating current is supplied to the phase-change material 5, the phase-change material 5 produces a phase transition between a high-resistance state thereof and a low-resistance state thereof due to Joule heat generated by the operating current. The high-resistance state is a state having a high resistivity, and the low-resistance state is a state having a low resistivity, wherein the low resistivity is lower than the high resistivity. The semiconductor memory device of the present embodiment stores data by using the phase transition. On the other hand, unlike the phase-change material 5, the high-resistance material 4 is a non-phase-change material that does not have a phase transition as a result of heating thereof in the temperature range required to change the state of the phase change material 5.

As described later herein, the high-resistance material 4 and the phase-change material 5 are produced, for example, by oxidizing a GeSbTe film, and thereby converting the oxidized GeSbTe film into a GeOX portion (i.e., a high-resistance material 4) and a SbTeX portion (i.e., a phase-change material 5). Such separation occurs because the free energy of formation of Ge oxide (GeOX) is smaller than the free energy of formation of Te oxide (TeOX) or Sb oxide (SbOX). That is, since Ge is the most easily oxidized as among Ge, Sb, and Te, the GeSbTe film separates into a GeOX region film and a SbTeX region upon oxidation thereof.

Similarly, since Ge is most likely to be nitrided as among Ge, Sb, and Te, the GeSbTe film becomes separated into a GeN portion and a SbTeX portion upon oxidation thereof. Such a separation occurs because the free energy of formation of Ge nitride (GeN) is smaller than the free energy of formation of Te nitride (TeN) or Sb nitride (SbN). Note that Si, Al, Co, Ti, Ta, Hf, Zr, and Y are all more easily oxidized and nitrided than are Te and Sb.

In the present embodiment, the resistivity of the high-resistance material 4 is higher than the resistivity of the phase-change material 5 in both the high-resistance and low-resistance state of the phase-change material 5. As a result, Joule heat can be efficiently generated by the operating current in the high-resistance material 4 and supplied to the phase-change material 5. Further, in the present embodiment, the thermal conductivity of the high-resistance material 4 is lower than the thermal conductivity of the phase-change material 5. This effectively confines the Joule heat in the phase-change material 5 and makes it difficult for the Joule heat to escape from the phase-change material 5. As a result, according to the present embodiment, it is possible to produce the phase transition of the phase-change material 5 with a small operating current.

Further, in the present embodiment, the melting point of the high-resistance material 4 is higher than the melting point of the phase-change material 5. This prevents the high-resistance material 4 from melting and reacting with the phase-change material 5 when a phase transition of the phase-change material 5 is produced.

From the viewpoint of the current path, in the present embodiment, since only the particles on a current path therethrough between the crossing regions of the upper electrode 6 over the lower electrode 3 operate among the particles (i.e., the phase-change material) distributed in the high-resistance material 4, the operating region of the phase-change material 5 is small. Since this also contributes to the reduction of the operating current, according to the present embodiment, producing the phase transition of the phase-change material 5 is made even more efficient.

The upper electrode 6 is formed on the high-resistance material 4. The upper electrode 6 may consist of a barrier metal layer and an electrode material layer separately, or may be a layer that is both a barrier metal layer and an electrode material layer. The upper electrode 6 of the present embodiment has a TiN film as a layer that serves as both a barrier metal layer and an electrode material layer. The upper electrode 6 may consist of a TiN film as a barrier metal layer, and may include a W film, a WN film, a WSi film, or a WSiN film as an electrode material layer. The upper electrode 6 of the present embodiment extends in the X direction and functions as a bit line. Like the lower electrode 3, the upper electrode 6 is formed within an insulating film (not shown).

In the semiconductor memory device of the present embodiment, by supplying an operating current between the lower electrode 3 and the upper electrode 6, an operating current can be supplied to the phase-change material 5 via the high-resistance material 4 to produce a phase transition in the phase-change material 5 using the heat generated in the high-resistance material 4.

FIGS. 2A, 2B, 2C and 2D show cross-sectional views showing a structure of a semiconductor memory device according to various modifications of the first embodiment.

In FIG. 2A, a thermal control layer 7 is formed between the lower electrode 3 and the high-resistance material 4 and between the high-resistance material 4 and the upper electrode 6. The thermal control layer 7 is provided to control the amount of heat escaping or flowing from the phase-change material 5.

In FIG. 2B, a selector layer 8 is formed between the high-resistance material 4 and the upper electrode 6. The selector layer 8 is used to select memory cells to be subjected to a setting or resetting operation (i.e., the phase-change material 5).

The selector layer 8 may be formed between the upper electrode 6 and an additional upper electrode 9 (FIG. 2C). In this case, the lower electrode 3, the high-resistance material 4, the upper electrode 6, the selector layer 8, and the additional upper electrode 9 may be provided within the insulating film 2 (FIG. 2D).

FIGS. 3A, 3B and 3C show cross-sectional views showing a method of manufacturing the semiconductor memory device according to the first embodiment.

First, the insulating film 2 is formed on the substrate 1, and then a lower electrode 3 is formed within the insulating film 2 (FIG. 3A). In the present embodiment, the lower electrode 3 may be formed after forming the insulating film 2, or the insulating film 2 may be formed after forming the lower electrode 3.

Next, a phase-change layer 11 is formed on the lower electrode 3 by PVD (Physical Vapor Deposition) (FIG. 3A). The phase-change layer 11 is, for example, the aforementioned GeSbTe film. The phase-change layer 11 is an example of a first layer. In the present embodiment, the phase-change layer 11 is formed at a temperature of 200° C. or lower, which is a temperature at which the phase-change layer 11 does not aggregate.

Next, oxygen annealing of the phase-change layer 11 is performed at 100° C. or lower to oxidize the phase-change layer 11 (FIG. 3B). As a result, the phase-change layer 11 changes to an oxidized phase-change layer 12. The oxidized phase-change layer 12 is, for example, a GeSbTeOX layer. The temperature of oxygen annealing is an example of a first temperature. Oxygen annealing of the present embodiment is preferably performed at a temperature of 200° C. or less and lower than the temperature at which the phase-change layer 11 is formed. This makes it possible to uniformly oxidize the phase-change layer 11 to the oxidized phase-change layer 12 while maintaining the state of the phase-change layer 11.

In the steps of FIGS. 3A and 3B, instead of forming the oxidized phase-change layer 12 from the phase-change layer 11, the oxidized phase-change layer 12 may be formed on the lower electrode 3 by PVD in an atmosphere in which oxygen is present. In this case, the process of forming the phase-change layer 11 is unnecessary.

Next, the oxidized phase-change layer 12 is annealed at 180° C. or higher (FIG. 3C). Specifically, the upper electrode 6 is formed on the oxidized phase-change layer 12, and then the oxidized phase-change layer 12 is annealed at 400° C. or higher in an Ar (argon) atmosphere (FIG. 3C). As a result, Te and Sb in the oxidized phase-change layer 12 aggregate, and the oxidized phase-change layer 12 is phase-separated into the phase-change material 5 (SbTeX film) and the high-resistance material 4 (GeOX film). Specifically, a structure is obtained in which Te and Sb agglomerate into a plurality of grain-shaped particles and the high-resistance material 4 surrounds the phase-change material 5. The annealing temperature of the oxidized phase-change layer 12 of the present embodiment is set higher than the oxygen annealing temperature of the phase-change layer 11. The annealing temperature of the oxidized phase-change layer 12 is an example of a second temperature. In this case, the atmosphere gas may be an inert gas other than Ar gas (e.g., N2 gas).

The annealing of the oxidized phase-change layer 12 may be performed before forming the upper electrode 6, or may be performed after forming the upper electrode 6. In the former case, since the oxidized phase-change layer 12 is not covered with the upper electrode 6, the annealing temperature may be set to a low temperature of 300° C. or lower. On the other hand, in the latter case, since the oxidized phase-change layer 12 is covered with the upper electrode 6, the annealing temperature may be set to a high temperature of 300° C. or higher.

Therefore, in FIG. 3C, the annealing temperature is set to 400° C. or higher. The temperature of 400° C. is close to the sublimation temperature of Te. Given that it is not desirable for Te to escape from the oxidized phase-change layer 12 by sublimation, Te can be prevented from escaping by sublimation from the oxidized phase-change layer 12 by covering the oxidized phase-change layer 12 with the upper electrode as in FIG. 3C. Therefore, in FIG. 3C, by setting the annealing temperature to 400° C. or higher, it is possible to sufficiently anneal the oxidized phase-change layer 12 while suppressing Te leakage therefrom.

On the other hand, when the oxidized phase-change layer 12 is not covered with the upper electrode 6, the annealing temperature is set to 300° C. or lower in order to suppress Te leakage therefrom. The reason why the temperature is set to 300° C. or lower instead of 400° C. or lower is to provide a margin between the sublimation temperature and the annealing temperature. In this case, annealing is performed for a longer time in order to sufficiently anneal the oxidized phase-change layer 12.

In the present embodiment, when the oxidized phase-change layer 12 (i.e., the GeSbTeOX film) is formed by oxidization, the oxidized phase-change layer 12 is oxidized so that the number of O atoms in the oxidized phase-change layer 12 is increased to some extent. The purpose of this is that a structure in which the phase-change material 5 surrounds the high-resistance material 4 is obtained when the number of O atoms is small, but a structure in which the high-resistance material 4 surrounds the phase-change material 5 is obtained when the number of O atoms is large. Such oxidation can be achieved, for example, by increasing the flow rate of O2 gas supplied at the time of oxidation. The value of X in the GeOX film of the present embodiment is, for example, 1.0 or more, and the number of O atoms is equal to or more than the number of Ge atoms.

In the present embodiment, the oxidation is performed so that the element (Ge) to constitute the high-resistance material 4 is completely oxidized and the element (Te or Sb) to constitute the phase-change material 5 is not significantly oxidized. The reason is that if too many O atoms are present, the phase-change characteristics of the phase-change material 5 may be weakened, and if too few O atoms are present, a preferable high-resistance material 4 may not be formed.

As described above, the semiconductor memory device of the present embodiment has the phase-change material 5 surrounded by the high-resistance material 4. Therefore, according to the present embodiment, it is possible to produce a structure capable of reducing the operating current supplied to the phase-change material 5.

The shape of each particle of the phase-change material 5 is spherical in FIG. 1 or the like, but may be a shape other than spherical. Examples of such particles are described in the second and third embodiments.

Second Embodiment

FIGS. 4A, 4B, 4C and 4D show cross-sectional views showing a method of manufacturing the semiconductor memory device according to a second embodiment.

Figure 4A:
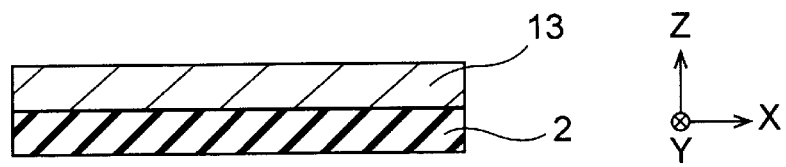
FIGS. 4A, 4B, 4C and 4D show cross-sectional views showing a method of manufacturing the semiconductor memory device according to a second embodiment.

First, the insulating film 2 and the lower electrode 3 are formed on the substrate 1 as described above, and the phase-change layer 13 is formed on the insulating film 2 and the lower electrode 3 by PVD (FIG. 4A). Illustration of the substrate 1 and the lower electrode 3 is omitted for convenience. The phase-change layer 13 is, for example, a SbTeX film.

Figure 4B:
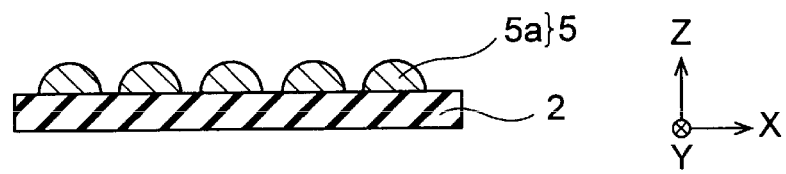

Next, the phase-change layer 13 is annealed at 300° C. or lower (FIG. 4B). As a result, Te and Sb in the phase-change layer 13 agglomerate, and the phase-change layer 13 is changed into a plurality of grain-shaped particles made of the phase-change material 5a. The composition of the phase-change material 5a is SbTeX, same as the phase-change layer 13. However, Te may sublime at the time of annealing, and in that case, the value of X after annealing is lower than the value of X before annealing.

Figure 4C:
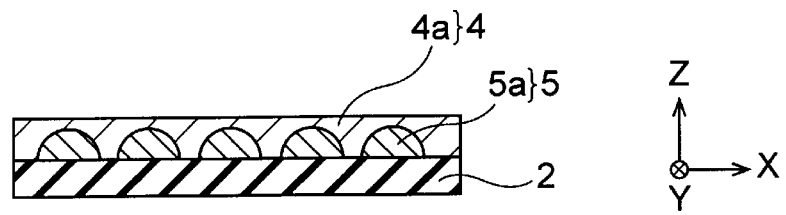

Next, a high-resistance material 4a is formed on top of the phase-change material 5a (FIG. 4C). The high-resistance material 4a is, for example, a GeOX film.

Figure 4D:
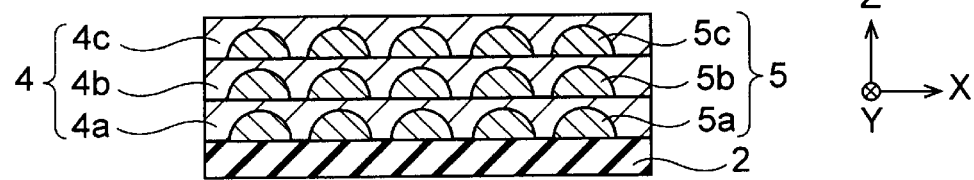

Thereafter, the processes of FIGS. 4A to 4C are executed repeatedly (FIG. 4D). As a result, a plurality of particles of the phase-change material 5b is formed on the high-resistance material 4a, and the high-resistance material 4b is formed on top of the phase-change material 5b. Further, a plurality of particles of the phase-change material 5c is formed on the high-resistance material 4b, and the high-resistance material 4c is formed on top of the phase-change material 5c.

In this manner, the high-resistance material 4, consisting of multiple layers of high-resistance material 4a to 4c, and the phase-change material 5, consisting of multiple layers of phase-change material 5a to 5c, are formed. The particles made of the phase-change material 5a are surrounded by the high-resistance material 4 in the XY cross section, but are in contact with the insulating film 2 (or the lower electrode 3) in the XZ cross section and the YZ cross section. On the other hand, each particle made of the phase-change material 5b or 5c is surrounded by the high-resistance material 4 in any cross section. With such a structure, the high-resistance material 4 and the phase-change material 5 of the present embodiment can exert the same effect as the high-resistance material 4 and the phase-change material 5 of the first embodiment.

The phase-change layer 13 in FIG. 4A may be a GeSbTe film instead of a SbTeX film. In this case, instead of performing the steps of FIGS. 4B and 4C, the oxygen annealing of the phase-change layer 13 may be performed at 100° C. or lower, and the phase-change layer 13 may be annealed at 300° C. or lower. In this way, as in FIG. 4C, a plurality of particles of the phase-change material 5a distributed two-dimensionally and the high-resistance material 4a covering these particles can be formed. In this case, by executing these steps repeatedly, the high-resistance material 4 and the phase-change material 5 can be formed.

As described above, the semiconductor memory device of the present embodiment has the phase-change material 5 surrounded by the high-resistance material 4. Therefore, according to the present embodiment, as in the first embodiment, it is possible to produce a structure capable of reducing the operating current supplied to the phase-change material 5.

Third Embodiment

Figure 5A:
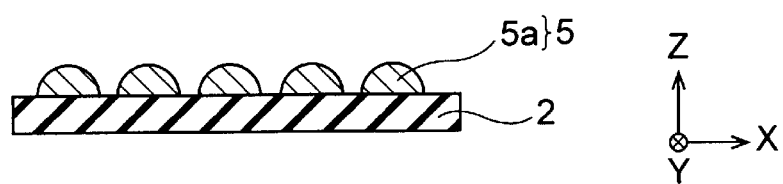
FIGS. 5A, 5B and 5C show cross-sectional views showing a method of manufacturing the semiconductor memory device according to a third embodiment.
Figure 5B:
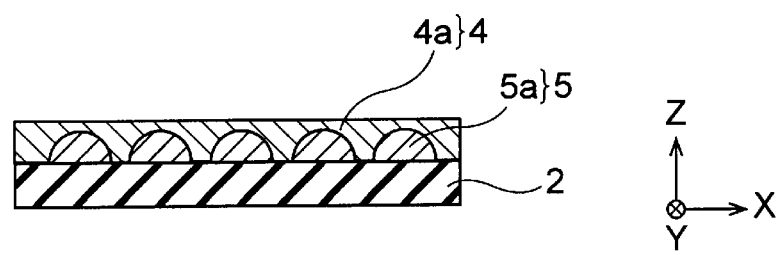
Figure 5C:
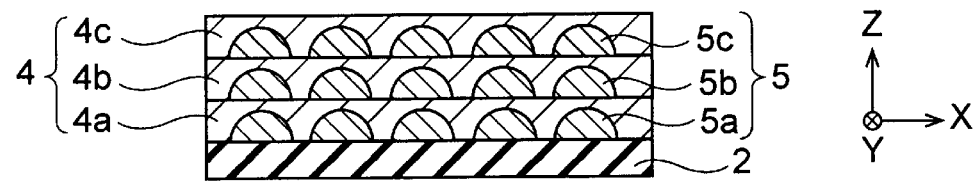

FIGS. 5A, 5B and 5C show cross-sectional views showing a method of manufacturing the semiconductor memory device according to a third embodiment.

First, the insulating film 2 and the lower electrode 3 are formed on the substrate 1 as described above, and a phase-change layer is formed on the insulating film 2 and the lower electrode 3 by PVD (FIG. 5A). Illustration of the substrate 1 and the lower electrode 3 is omitted for convenience.

In the step of FIG. 5A, a SbTeX film is formed as the phase-change layer at 300° C. As a result, Te and Sb in the phase-change layer are agglomerated to form a plurality of particles made of the phase-change material 5a. The composition of the phase-change material 5a is SbTeX, same as the phase-change layer. The size and density of the particles can be controlled by film-forming temperature, power density, film-forming time, and the like when the phase-change layer is formed.

Next, a high-resistance material 4a is formed on top of the phase-change material 5a (FIG. 5B). The high-resistance material 4a is, for example, a GeOX film.

Thereafter, the steps of FIG. 5A and FIG. 5B are executed repeatedly (FIG. 5C). As a result, a plurality of particles of the phase-change material 5b is formed on the high-resistance material 4a, and the high-resistance material 4b is formed on top of the phase-change material 5b. Further, a plurality of particles of the phase-change material 5c is formed on the high-resistance material 4b, and the high-resistance material 4c is formed on top of the phase-change material 5c.

In this manner, the high-resistance material 4, consisting of multiple layers of high-resistance material 4a to 4c, and the phase-change material 5, consisting of multiple layers of phase-change material 5a to 5c, are formed. The particles of the phase-change material 5 of the present embodiment have the same shape as the particles of the phase-change material 5 of the second embodiment.

As described above, the semiconductor memory device of the present embodiment has the phase-change material 5 surrounded by the high-resistance material 4. Therefore, according to the present embodiment, as in the first and second embodiments, it is possible to produce a structure capable of reducing the operating current supplied to the phase-change material 5.

While several embodiments are described above, these embodiments are presented by way of example only and are not intended to limit the scope of the disclosure. The novel device and methods described herein may be embodied in various other forms. Various omissions, substitutions, and alterations may be made to the embodiments of the device and methods described in this specification without departing from the scope of the disclosure. The appended claims and their equivalents are intended to cover such forms and modifications that fall within the scope and spirit of the disclosure.

What is claimed is:

1. A semiconductor memory device, comprising:
    a first electrode;
    a first layer provided on the first electrode, the first layer including a first material and a plurality of particles of a second material that are arranged in the first material, at least one of the particles of the second material being separated from any other of the particles and entirely surrounded by the first material, the second material containing a phase change material; and
    a second electrode provided on the first layer.

2. The semiconductor memory device according to claim 1, wherein
    the second material, upon joule heating thereof, undergoes a phase transition between a first state having a first resistivity and a second state having a second resistivity lower than the first resistivity, and
    an electrical resistivity of the first material is higher than the first and second resistivities of the second material.

3. The semiconductor memory device according to claim 1, wherein a melting point of the first material is higher than a melting point of the second material.

4. The semiconductor memory device according to claim 1, wherein a thermal conductivity of the first material is lower than a thermal conductivity of the second material.

5. The semiconductor memory device according to claim 1, wherein the first material contains oxygen or nitrogen.

6. The semiconductor memory device according to claim 1, wherein
    the first material contains a first element,
    the second material contains a second element, and
    a free energy of formation of oxides or nitrides of the first element is smaller than a free energy of formation of oxides or nitrides of the second element.

7. The semiconductor memory device according to claim 6, wherein the second material contains tellurium as the second element.

8. The semiconductor memory device according to claim 6, wherein the first material contains at least one of germanium, silicon, aluminum, cobalt, titanium, tantalum, hafnium, zirconium, and yttrium as the first element.

9. A semiconductor memory device comprising:
    a first electrode;
    a first layer provided over the first electrode, the first layer including a first material and a plurality of particles of a second material that are arranged in the first material, the first material containing a first element, the second material containing a second element different from the first element; and
    a second electrode provided on top of the first layer, wherein
    a free energy of formation of oxides or nitrides of the first element is smaller than a free energy of formation of oxide or nitrides of the second element.

10. The semiconductor memory device according to claim 9, wherein the second material, upon joule heating thereof, undergoes a phase transition between a first state having a first resistivity and a second state having a second resistivity lower than the first resistivity, and an electrical resistivity of the first material is higher than the first and second resistivities of the second material.

11. The semiconductor memory device according to claim 9, wherein a melting point of the first material is higher than a melting point of the second material.

12. The semiconductor memory device according to claim 9, wherein a thermal conductivity of the first material is lower than a thermal conductivity of the second material.

13. The semiconductor memory device according to claim 9, wherein the first material contains oxygen or nitrogen.

14. The semiconductor memory device according to claim 9, wherein the second element comprises tellurium.

15. The semiconductor memory device according to claim 9, wherein the first element comprises at least one of germanium, silicon, aluminum, cobalt, titanium, tantalum, hafnium, zirconium, and yttrium.

* * * * *